(12) United States Patent
Sanduleanu

(10) Patent No.: US 6,943,632 B2
(45) Date of Patent: Sep. 13, 2005

(54) FREQUENCY LOCKED LOOP, CLOCK RECOVERY CIRCUIT AND RECEIVER

(75) Inventor: Mihai Adrian Tiberiu Sanduleanu, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 86 days.

(21) Appl. No.: 10/479,095
(22) PCT Filed: May 27, 2002
(86) PCT No.: PCT/IB02/01871
§ 371 (c)(1),
(2), (4) Date: Nov. 30, 2003
(87) PCT Pub. No.: WO02/097991
PCT Pub. Date: Dec. 5, 2002

(65) Prior Publication Data
US 2004/0145422 A1 Jul. 29, 2004

(30) Foreign Application Priority Data
May 31, 2001 (EP) .......................... 01202082

(51) Int. Cl.$^7$ .............................. H03L 7/00
(52) U.S. Cl. ...................... 331/1 R; 331/17
(58) Field of Search ................... 331/1 R, 17, 34, 331/41, 42, 43, 74; 327/141, 156; 375/376, 375

(56) References Cited

U.S. PATENT DOCUMENTS 5,521,557 A * 5/1996 Yamashita et al. ............ 331/11
6,643,346 B1 * 11/2003 Pedrotti et al. ............. 375/375

* cited by examiner

Primary Examiner—Linh My Nguyen
(74) Attorney, Agent, or Firm—Adam Stroud

(57) ABSTRACT

A frequency locked loop comprising a controllable oscillator (1) and a control signal generator (2) for generating a control signal (Sc) for the oscillator (1) from a reference signal (Sref) and an output signal (So) from the oscillator (1). The frequency locked loop is characterized in that, the control signal generator (2) comprises a first chain including a high pass filter (21) and a non-linear processing unit (22) for generating a first intermediate signal (S1) from the reference signal (Sref), a second chain including a high pass filter (23) and a non-linear processing unit (24) for generating a second intermediate signal (S2) from the output signal (So) of the controllable oscillator (1), a combination unit (25) for generating a third intermediary signal (S3) from the first (S1) and the second intermediary signal (S2), a low-pass filter (26) for providing the control signal (Sc) in response to the third intermediary signal (S3).

11 Claims, 6 Drawing Sheets

US 6,943,632 B2

FREQUENCY LOCKED LOOP, CLOCK RECOVERY CIRCUIT AND RECEIVER

The invention relates to a frequency locked loop comprising a controllable oscillator and a control signal generator for generating a control signal for the oscillator from a reference signal and an output signal from the oscillator.

Such a frequency locked loop is known from EP 395 109. In the known frequency locked loop the control signal generator comprises a divider having an input for receiving the output signal of the oscillator. An output signal of the divider is coupled to a first input of a phase comparator. A second input thereof is coupled to a frequency generator which generates a fixed frequency. An output of the phase comparator is coupled to a low-pass filter via a buffer. The output of the phase comparator is directly coupled to a fine control input of the oscillator. The output of the phase comparator is also coupled to a first input of a voltage comparator. The latter has a second input coupled to a reference voltage. The output of the voltage comparator is coupled via a buffer and a second low-pass filter to a course control input of the oscillator.

It is a purpose of the invention to provide a frequency locked loop having a simplified frequency detection. According to the invention, the frequency locked loop is characterized in that the control signal generator comprises
  a first chain including a high pass filter and a non-linear processing unit for generating a first intermediate signal from a reference signal,
  a second chain including a high pass filter and a non-linear processing unit for generating a second intermediate signal from the output signal of the controllable oscillator,
  a combination unit for generating a third intermediary signal from the first and the second intermediary signal,
  a low-pass filter for providing the control signal in response to the third intermediary signal.

The frequency locked loop according to the invention allows for a fast response to variations in the frequency of the input signal.

The embodiments of the invention according to claim 2 and claim 3 make it possible to change the ratio between the frequency of the output signal and the frequency of the reference signal without using a frequency divider. For the frequency of the output signal can be increased by increasing the magnification of the gain stage which couples the combination unit to the non-linear processing unit of the first chain. Likewise the frequency of the output signal can be increased by decreasing the magnification of the gain stage which couples the combination unit to the non-linear processing unit of the second chain. The magnification can be a factor greater than 1, but also a factor less than or equal to 1.

These and other aspects of the invention are described in more detail with reference to the drawing. Therein:

Figure 1:
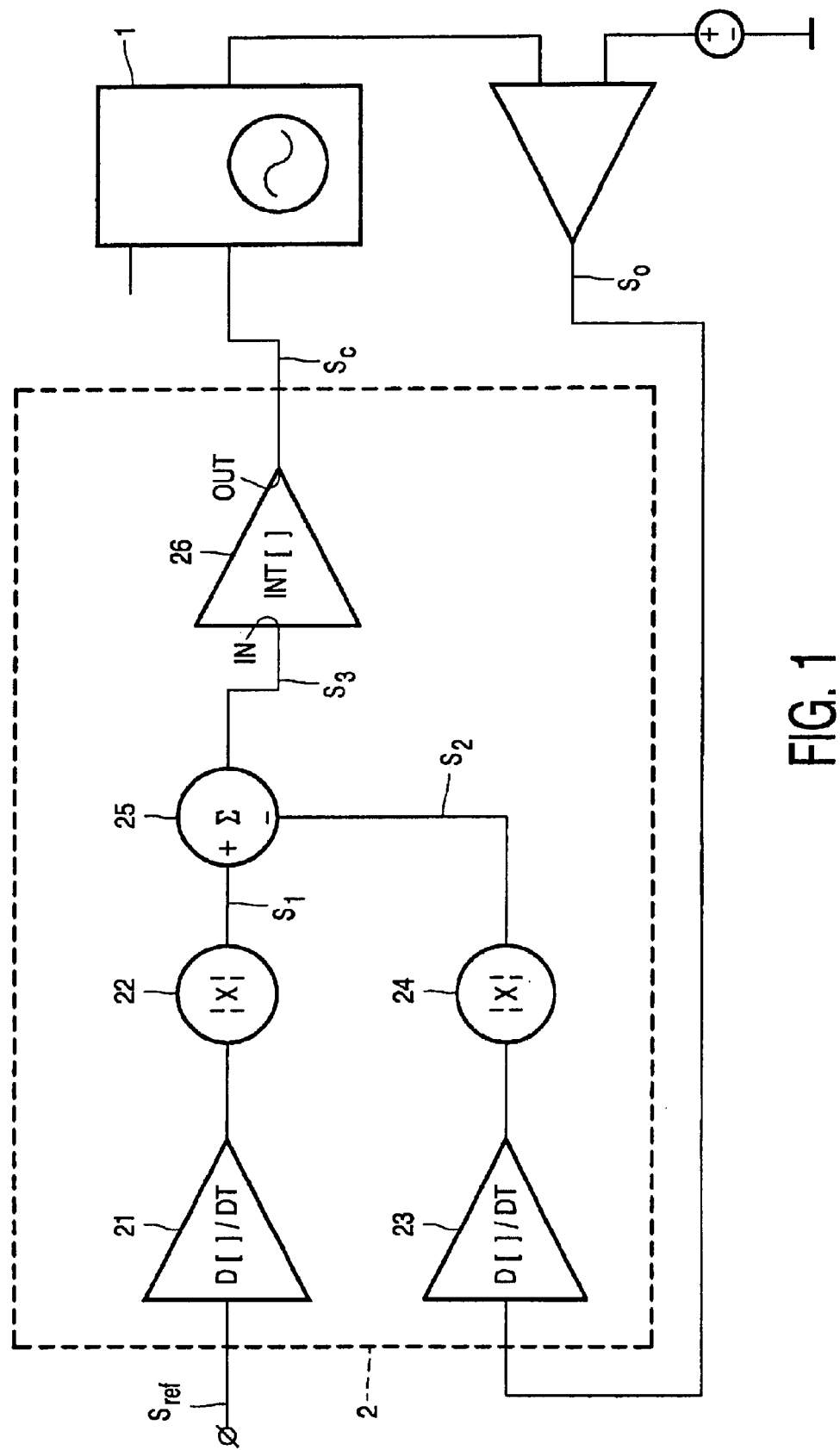
FIG. 1 shows a frequency locked loop according to the invention.

FIG. 1 shows a frequency locked loop comprising a controllable oscillator 1 and a control signal generator 2 for generating a control signal Sc for the oscillator 1 from a reference signal Sref and an output signal So from the oscillator 1. The frequency locked loop according to the invention is characterized in that the control signal generator 2 comprises a first chain including a high pass filter 21 and a non-linear processing unit 22 for generating a first intermediate signal S1 from a reference signal. The control signal generator 2 further comprises a second chain including a high pass filter 23 and a non-linear processing unit 24 for generating a second intermediate signal S2 from the output signal So of the controllable oscillator 1. The control signal generator 2 further comprises a combination unit 25 for generating a third intermediary signal S3 from the first S1 and the second intermediary signal S2. The control signal generator 2 comprises a low-pass filter 26 for providing the control signal Sc in response to the third intermediary signal S3.

In the embodiment shown in FIG. 1, the high pass filters 21 and 23 are differentiators, and the low pass filter 26 is an integrator. The non-linear processing units 22 are absolute value detectors.

Figure 2:
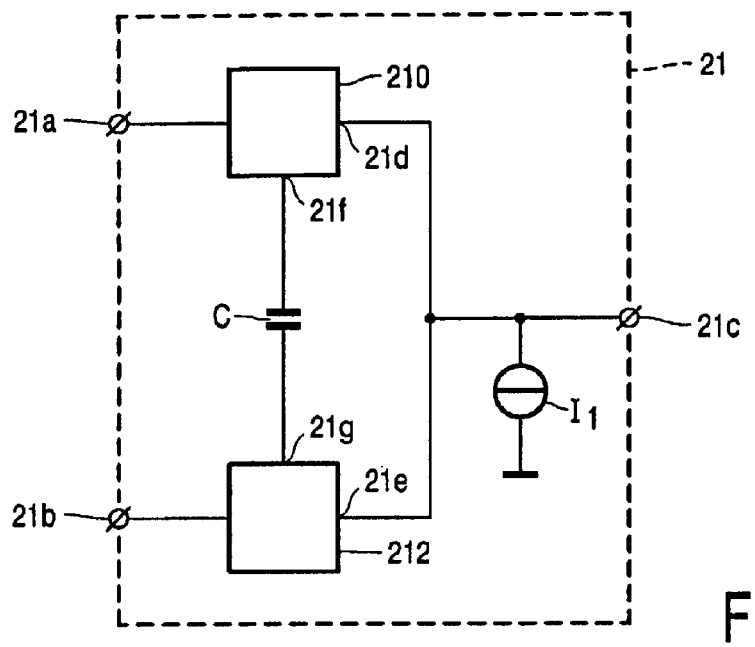
FIG. 2 shows in more detail a part of FIG. 1.

FIG. 2 shows an embodiment of the differentiator 21 of the frequency locked loop. The differentiator 23 is identical thereto. The differentiator 21 shown therein comprises a first and a second circuit module 210, 212, which are mutually coupled via a capacitive element C. The capacitive element C is coupled at a first side to the node 21f of circuit module 210, and at a second side to node 21g of circuit module 212. The circuit modules 210 and 212 are each coupled to a respective input 21a and 21b, and have outputs 21d, 21e, which are coupled a common output 21c which is coupled to a current source I1.

In the following the designation "transistor" will refer to a controllable semiconductor element such as a bipolar transistor or a unipolar transistor (MOSFET). Main electrodes are understood to be the emitter and collector of a bipolar transistor, or the source and the drain of a unipolar transistor. The wording control electrode is used to denote the base of a bipolar transistor or the gate of a uniplar transistor.

Figure 3:
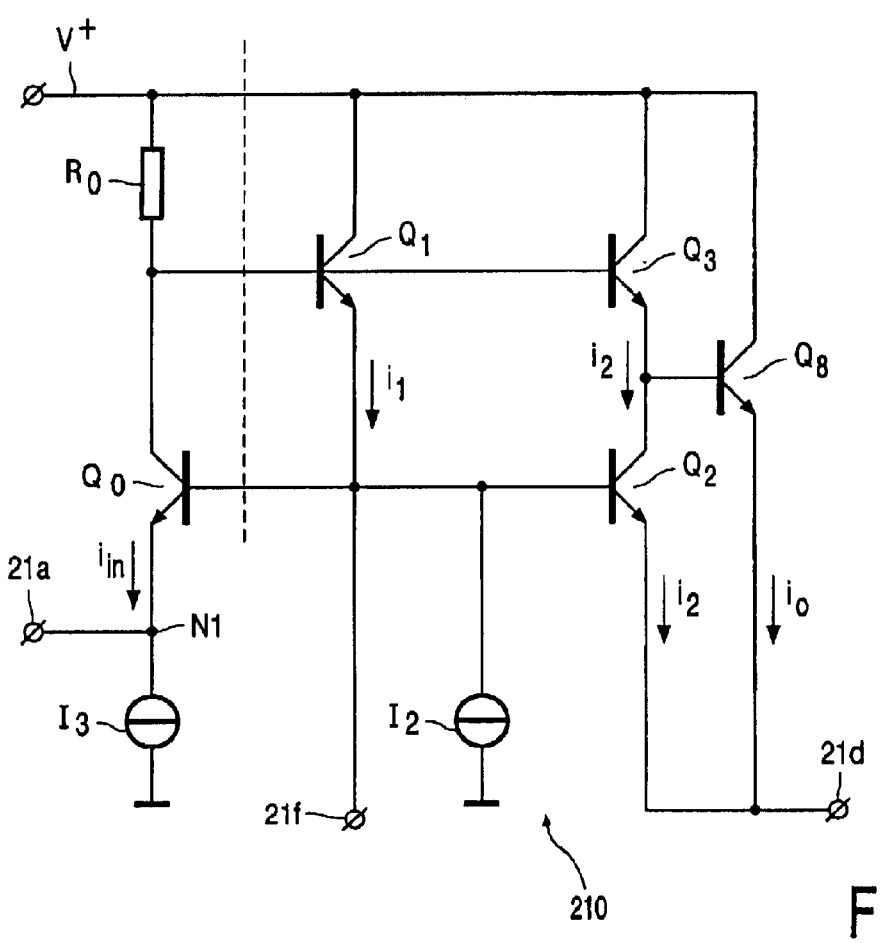
FIG. 3 shows in more detail a part of FIG. 2.

FIG. 3 shows a preferred embodiment of the first circuit module 210. The other circuit module 212 is identical thereto. Therein nodes 21b, 21g and 21e take the place of nodes 21a, 21f and 21d. The circuit module 210 shown therein comprises a first, a second, and a third chain. The first chain includes a resistive element R0 which couples a first main electrode of a first transistor Q0 to a first line of constant voltage. Another main electrode of the first transistor Q0 is coupled to a current source I3 in a node N1. The node is also coupled to the input 21a for receiving an input signal current $i_{in}$. The second chain comprises a second transistor Q1 having a first main electrode coupled to the first line of constant voltage, and a second main electrode coupled to a second current source I2. The second main electrode of the second transistor Q1 is also coupled to a control electrode of the first transistor Q0 and to the node 21f. A control electrode of the second transistor Q1 is coupled to the first main electrode of the first transistor Q0. The third chain of the circuit comprises a third and a fourth transistor. The third transistor Q3 has a first main electrode coupled to the first line of constant voltage and a second main electrode coupled to a first main electrode of the fourth transistor Q2. The fourth transistor Q2 has a second main electrode coupled to the output 21d. The third chain is bridged by the main current path of a fifth transistor Q8. The latter has its control electrode connected to the second main electrode of the third transistor.

The circuit operates as follows. If a signal current $i_{in}$ is applied at the input nodes this results in a voltage V over the capacitor C according to:

$$V = \frac{i_{in}}{gm} \quad (1)$$

The voltage V over the capacitor corresponds to a current $i_c$ through the capacitor, such that:

$$i_c = s.C.V \quad (2)$$

This current $i_c$ is approximately equal to the current $i_1$ provided by the controllable semiconductor element Q1, hence $$i_1 \approx s.C.V \quad (3)$$

Furthermore, in the circuit shown in FIG. 3 the following relation applies to the base-emitter voltages $V_{be1}$, $V_{be2}$, $V_{be3}$, $V_{be8}$ of Q1, Q2, Q3 and Q8 respectively:

$$V_{be1} + V_{be2} = V_{be3} + V_{be8} \quad (4)$$

This implies for the currents $i_1$, $i_2$ and $i_0$:

$$i_1.i_2 \approx i_2.i_0 \text{ or } i_1 \approx i_0 \quad (5)$$

Combining (3), (1) and (5) it follows:

$$i_0 \approx s \cdot \frac{C}{gm} i_{in} \quad (6)$$

Figure 4:
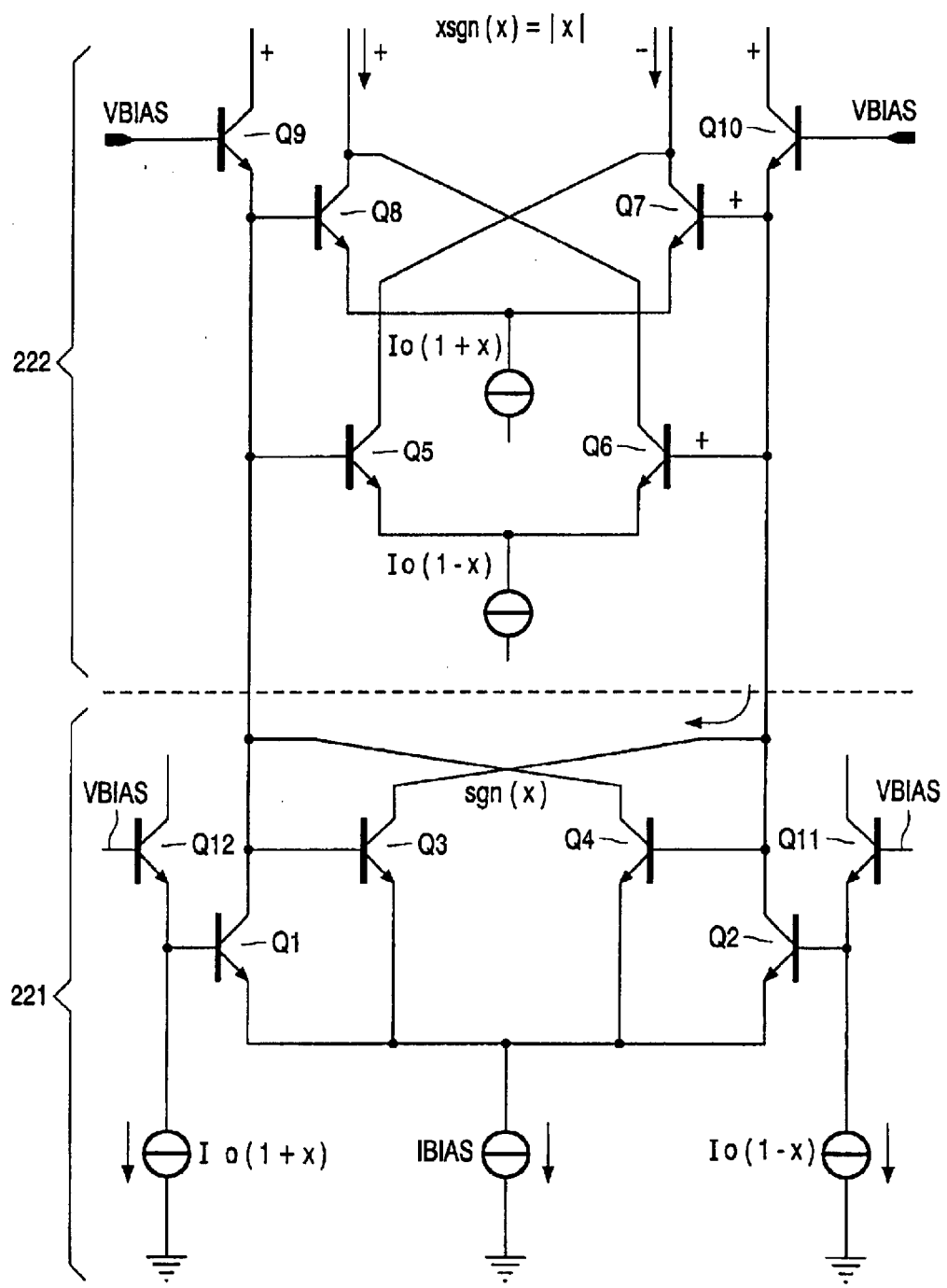
FIG. 4 shows in more detail another part of FIG. 1.

The modulus circuit 22 is shown in more detail in FIG. 4. The modulus circuit 24 is identical thereto. The circuit shown therein comprises a first circuit portion 221 for calculating the sign of the input signal and a second circuit portion 222 for multiplying the sign of the input signal with the momentaneous value of the input signal. The input signal is differential, including a first current Io(1+x) and a second current Io(1+x). The input signal is applied both to the first circuit portion and to the second circuit portion. The first portion comprises a latch Q1, Q2, Q3, Q4. The inputs thereof are formed by the control electrodes of the semiconductor elements Q1 and Q2. The inputs are coupled to a main electrode of a further semiconductor element Q11, Q12. The semiconductor elements Q12, Q1, Q2, Q11 form a translinear loop, which ensures that a copy of the input current flows in the transistors Q1 and Q2. The transistors Q3 and Q4 are connected such that any imbalance in the collectors Q1 and Q2 is amplified and finally the current IBIAS will flow either in the transistor Q9 or in the transistor Q10, dependent on the sign of the input current. Multiplying the input current with its sign in the second portion an output signal is obtained which is representative for the modulus of the input signal. In order to avoid hysterezis, two fixed current sources can be added in the emitters of Q9 and Q10.

Figure 5:
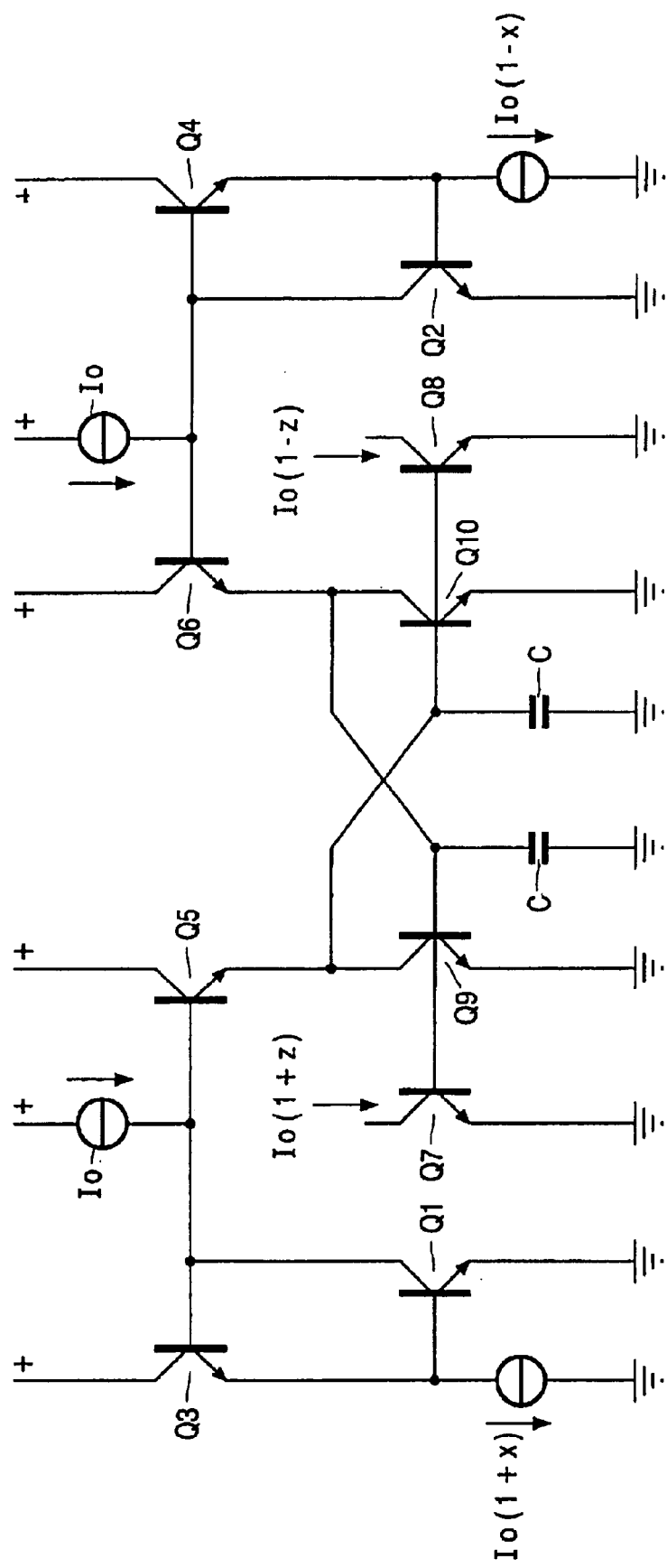
FIG. 5 shows in more detail a further part of FIG. 1.

FIG. 5 shows a possible implementation of the integrator 26, a modified version of the class AB integrator from E. Seevinck, "Companding current-mode integrator: A new circuit principle for continuous-time monolithic filters", Electron. Lett., vol. 26, no. 24, pp. 2046–2047, November 1990.

It can be shown that:

$$xI_0 = CV_T \frac{dz}{dt} \quad (1)$$

Hence, from (1) results that the differential current flowing in the output transistors Q7 and Q8 amounts:

$$z = \frac{I_0}{CV_T} \int x dt$$

Figure 6:
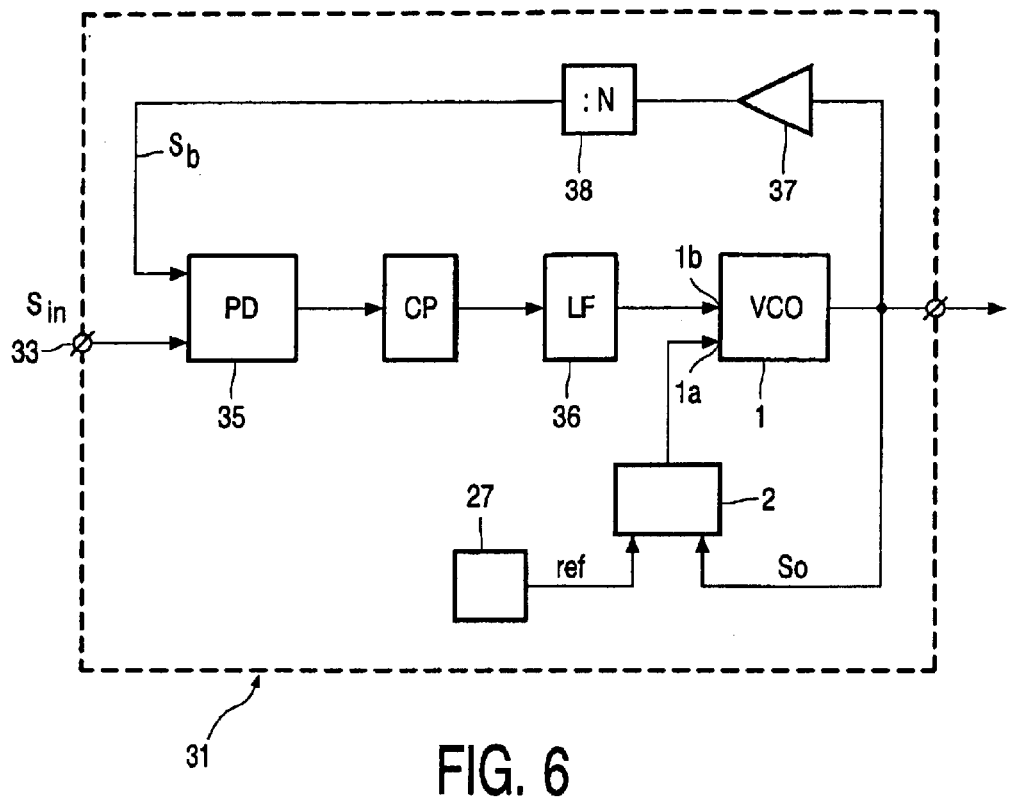
FIG. 6 shows a clock recovery circuit comprising the frequency locked loop of FIG. 1.

FIG. 6 shows a clock recovery circuit 31 which comprises a controllable oscillator 1. The controllable oscillator 1 is part of a frequency locked loop further including the control signal generator 2. The controllable oscillator 1 has a course tuning port 1a which is coupled to the control signal generator 2. The control signal generator receives a reference signal Sref from a reference signal generator 27, such as a crystal. The controllable oscillator 1 also forms part of a phase locked loop which comprises a phase detector 35 for generating a phase difference signal Sd which is indicative for a phase difference between the input signal Sin and a feedback signal Sb. The feedback signal Sfb is obtained by a frequency divider 38 from the output signal of the controllable oscillator 1.

Figure 7:
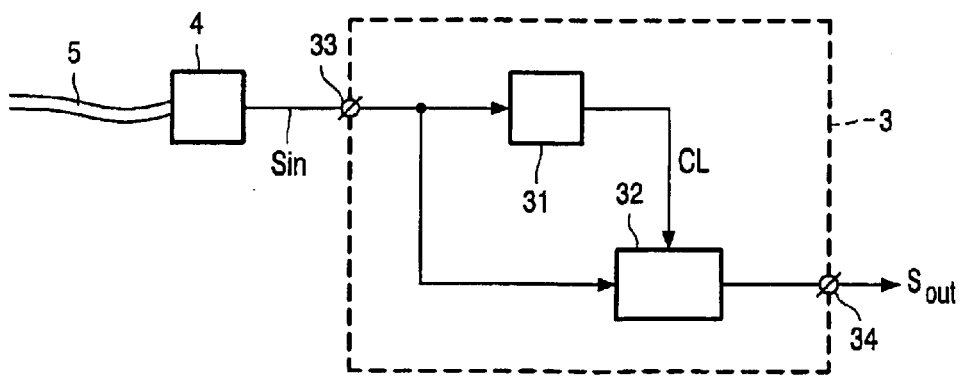
FIG. 7 shows a receiver comprising the clock recovery circuit of FIG. 6.

FIG. 7 shows a receiver 3 for a fibre-optic channel 5. The receiver comprises an input 33 for receiving an input signal Sin from an sensor 4 which is coupled to the fibre-optic channel 5. A clock recovery circuit 31 according to the invention is coupled to the input 33 for receiving said input signal Sin as the reference signal. A data recovery circuit 32 is coupled to the clock recovery circuit 31 and to the input 33. The data recovery circuit generates a digital output signal Sout in response to the input signal Sin, and an output signal Cl of the clock recovery circuit 31. The digital output signal Sout is provided at an output 34 of the receiver 3.

Figure 8:
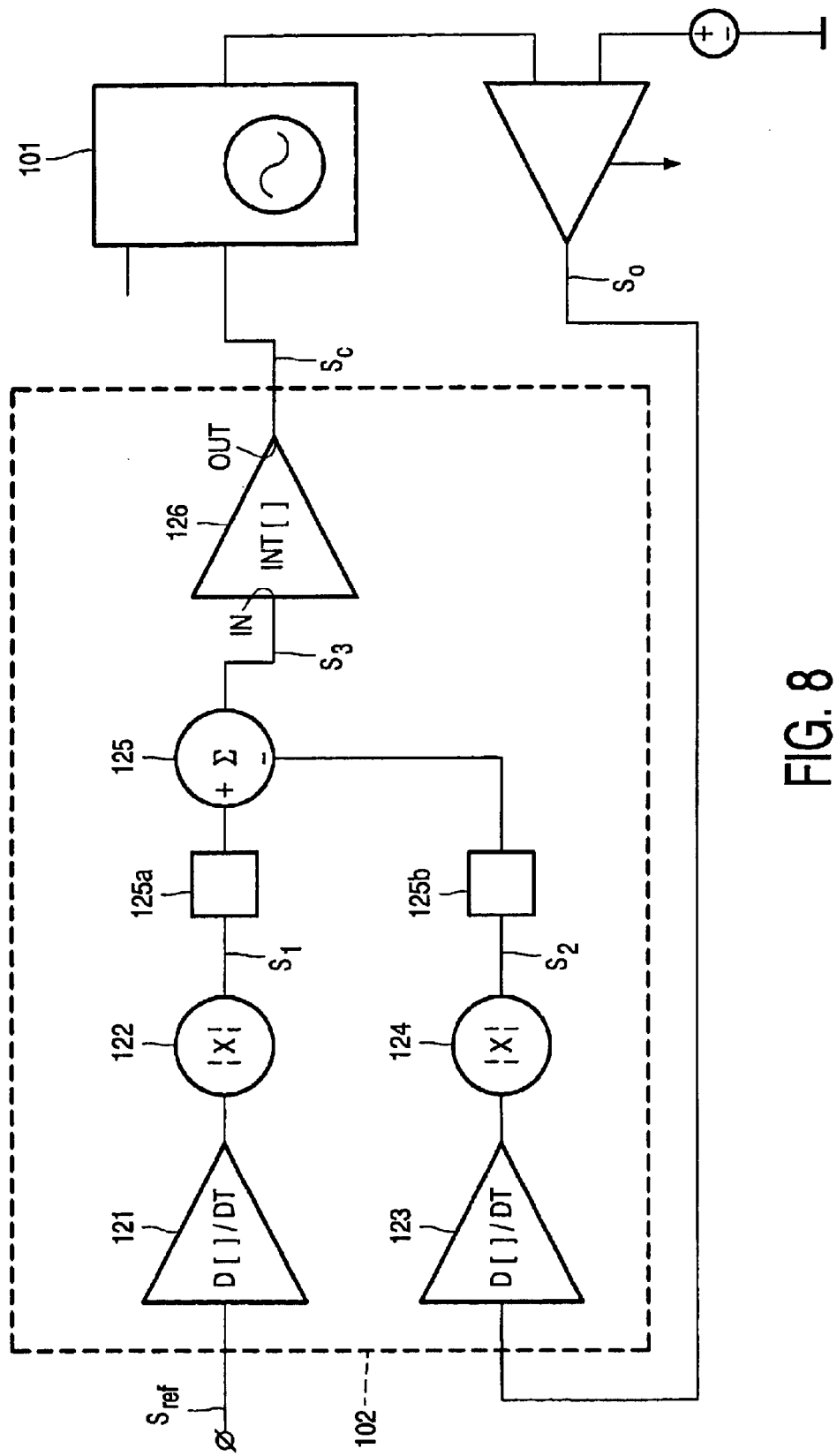
FIG. 8 shows an alternative embodiment of the frequency locked loop according to the invention.

FIG. 8 shows an alternative embodiment of the frequency locked loop circuit according to the invention. In FIG. 1, elements corresponding to those of FIG. 1 have a reference number which is 100 higher. The frequency locked loop circuit shown therein is characterized in that the combination unit 125 is coupled to the non-linear processing unit 122 of the first chain with a gain stage 125a. In the embodiment shown therein, the combination unit 125 is coupled to the non-linear processing unit 124 of the second chain with a gain stage 125b too. By changing the gain of the stages, the ratio between the frequency of the reference signal Sref, and the frequency of the output signal So can be changed. For example, the frequency of the output signal So can be increased by increasing the magnification of the gain stage 125a, which couples the combination unit 125 to the non-linear processing unit 122 of the first chain. Likewise the frequency of the output signal So can be increased by decreasing the magnification of the gain stage 125b which couples the combination unit 125 to the non-linear processing unit 124 of the second chain. The magnification can be a factor greater than 1, but also a factor less than or equal to 1.

What is claimed is:

1. A frequency locked loop comprising a controllable oscillator (1) and a control signal generator (2) for generating a control signal (Sc) for the oscillator (1) from a reference signal (Sref) and an output signal (So) from the oscillator (1), characterized in that, the control signal generator (2) comprises:
   a first chain including a high pass filter (21) and a non-linear processing unit (22) for generating a first intermediate signal (S1) from the reference signal (Sref), a second chain including a high pays filter (23) and a non-linear processing unit (24) for generating a second intermediate signal (S2) from the output signal (So) of the controllable oscillator (1), a combination unit (25) for generating a third intermediary signal (S3) from the first (S1) and the second intermediary signal (S2), a low-pass filter (26) for providing the control signal (Sc) in response to the third intermediary signal (S3).

2. A frequency locked loop circuit according to claim 1, characterized in that the combination unit (125) is coupled to the non-linear processing unit (122) of the first chain with a gain stage (125a).

3. A frequency locked loop circuit according to claim 1, characterized in that the combination unit (125) is coupled to the non-linear processing unit (124) of the second chain with a gain stag (125b).

4. A frequency locked loop according to claim 1, characterized in that the high pass filter (21, 23) is a differentiator.

5. A frequency locked loop loop according to claim 1, characterized in that the low pass filter (26) is an integrator.

6. A frequency locked loop according to claim 1, characterize in that the non-linear processing unit (22, 24) is an absolute value detector.

7. A frequency locked loop according to claim 4, wherein the differentiator comprises a first (210) and a second circuit module (212) which are mutually coupled via a capacitive element (C).

8. A frequency locked loop according to claim 4, characterized in that the differentiator comprises a translinear loop (Q2, Q3, Q4, Q5).

9. A frequency locked loop according to claim 6, characterized in that he absolute value detector (21) comprises a first circuit portion (221) for calculating the sign of the input signal and a second circuit portion (222) for multiplying the sign of the input signal with the momentaneous value of the input signal.

10. A clock recovery circuit comprising a controllable oscillator (1) which both is part of a frequency locked loop as claimed in claim 1 and of a phase locked loop.

11. A receiver (3) for a fibre-optic channel (5) comprising
an input (33) for receiving an input signal (Sin) from an sensor (4) which is coupled to the fibre-optic channel (5), a clock recovery circuit (31) according to claim 10 coupled to the input (33) for receiving said input signal (Sin) as a reference signal, a data recover circuit (32) coupled to said clock recovery circuit (31) and the input (33), for generating a digital output signal (Sout) in response to the input signal (Sin), and an output signal (CL) of the clock recovery circuit (31), an output (34) or providing the digital output signal (Sout).

* * * * *